Figure 1:
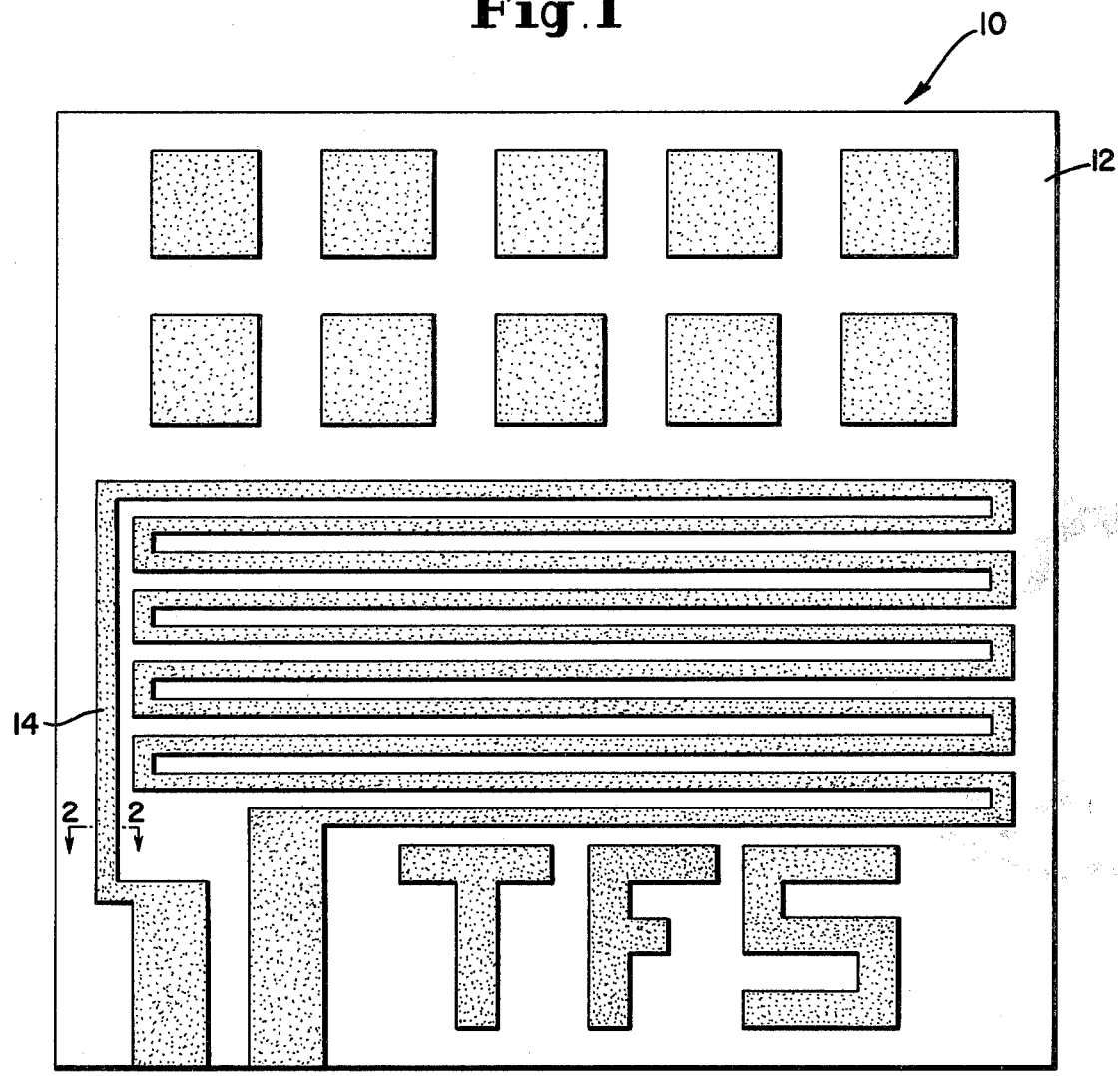

United States Patent [19]

Provance et al.

[11] 4,322,316

[45] Mar. 30, 1982

[54] THICK FILM CONDUCTOR EMPLOYING COPPER OXIDE

[75] Inventors: Jason D. Provance; Kevin W. Allison, both of Santa Barbara, Calif.

[73] Assignee: Ferro Corporation, Cleveland, Ohio

[21] Appl. No.: 180,298

[22] Filed: Aug. 22, 1980

[51] Int. Cl.$^3$ ............................................. H01B 1/02
[52] U.S. Cl. ...................... 252/512; 252/518; 428/210; 428/901; 427/96; 427/123; 427/126.1; 427/126.2; 106/1.12; 427/126.3
[58] Field of Search ............... 252/512, 518; 428/427, 428/433, 209, 210, 215, 901, 323, 325, 328; 427/96, 102, 123, 126.1, 126.3, 126.6; 106/1.05, 1.26

[56] References Cited

U.S. PATENT DOCUMENTS

| | | | |
|---|---|---|---|
| 4,072,771 | 2/1978 | Grier | 252/512 |
| 4,122,232 | 10/1978 | Kuo | 252/513 |
| 4,172,919 | 10/1979 | Mitchell | 252/512 |

*Primary Examiner*—Benjamin R. Padgett
*Assistant Examiner*—J. L. Barr
*Attorney, Agent, or Firm*—Quaintance & Murphy

[57] ABSTRACT

A thick film conductor, a process for producing such, and a thick film conductor paste of:
- A. 7 to 27 weight percent boron; and
- B. zero to 35 weight percent glass frit; and
- C. balance essentially copper oxide.

22 Claims, 2 Drawing Figures

THICK FILM CONDUCTOR EMPLOYING COPPER OXIDE

BACKGROUND OF THE INVENTION

This invention relates to thick film conductors employing oxides of copper.

Thick film conductors are well known in the art and are acquiring increasing importance in view of trends in the electronic industry towards smaller and smaller circuits. In the past, thick film conductors have been produced wherein the circuit was of a noble metal. By noble metal is meant gold, silver, palladium, platinum mixtures thereof and alloys thereof. More recently, considerable efforts have been expended in attempting to produce thick film conductors employing base metals such as copper, nickel, and cobalt. Examples of such efforts are described, for example, in:

U.S. Pat. No. 4,070,517 to Kazmierowicz; and
U.S. Pat. No. 4,070,518 to Kazmierowicz; and
U.S. Pat. No. 4,072,771 to Grier; and
U.S. Pat. No. 4,079,156 to Youtsey et al; and
U.S. Pat. No. 4,082,898 to Miller et al; and
U.S. Pat. No. 4,122,232 to Kuo; and
U.S. Pat. No. 4,140,817 to Brown; and
U.S. Pat. No. 4,158,716 to Miller et al; and
U.S. Pat. No. 4,172,919 to Mitchell.

Unfortunately, the prior art suffers from a number of disadvantages. The use of copper is burdensome because copper powder tends to oxidize on storage. The oxidation of copper powder on storage gives the copper powder an oxide coating which means that the powder is in reality a composition of copper and copper oxide of varying proportions depending upon the degree of oxidation.

Many commercially available substrates have limited firing temperatures. For example porcelain coated steel, glass, and glass bonded mica become soft when heated to temperatures above about 675° C. Many commercially available thick film conductor pastes must be fired above 675° C. which means that they cannot be employed with these substrates.

Another problem in the prior art is the great expense of copper which, although less than that of the noble metals, is nevertheless greater than desired.

Another severe problem of the prior art is the necessity of employing an inert atmosphere such as that of nitrogen or a reducing atmosphere such as that of hydrogen. Nitrogen atmospheres and the special belt furnaces necessary to employ a nitrogen atmosphere are expensive. Hydrogen atmospheres, in addition to being expensive, are potentially explosive and also require special furnaces for their utilization.

It is therefore an object of the present invention to provide an improved thick film conductor paste substantially free of one or more of the disadvantages of prior pastes.

An additional object of the present invention is to provide a process and a thick film conductor paste that can be fired in air.

Yet another object of the present invention is to provide a thick film conductor paste that can be fired at temperatures below 675° C.

Another object of the present invention is to provide an improved thick film conductor paste which does not employ a noble metal.

Yet another object of the present invention is to provide an improved thick film conductor paste which does not require the presence of copper metal but will tolerate the presence of copper metal.

Yet another object of the present invention is to provide a thick film conductor paste that has a long shelf life.

Still another object of the present invention is to provide an improved method for making a thick film conductor.

Still another object of the present invention is to provide an improved thick film conductor.

Still another object of the present invention is to provide an improved thick film conductor paste capable of being fired onto substrates of glass, porcelain coated steel and glass bonded mica at a temperature below the softening temperature of the substrate.

Figure 2:
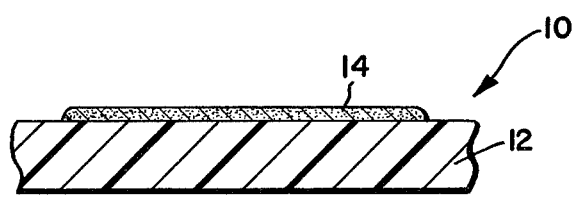

Additional objects and advantages of the present invention will be readily apparent to those skilled in the art by reference to the following detailed description and drawings wherein:

FIG. 1 is a plan view of a thick film conductor 10 of the present invention; and wherein, FIG. 2 is an enlarged sectional view taken along line 2—2 of FIG. 1.

According to the present invention, there is provided a thick film conductor paste of:

a. 7 to 27 and preferably 10 to 20 weight percent boron; and
b. zero to 35 and preferably 5 to 25 weight percent glass frit; and
c. a balance essentially copper oxide wherein all weight percentages are on a dry basis.

According to another aspect of the present invention, there is provided a method for making a thick film conductor comprising the steps of:

I. depositing the thick film conductor paste on an electrically non-conductive substrate in the form of a circuit to form a coated substrate; and then
II. heating the coated substrate in air at a temperature of 500° to 675° C. for a time sufficient to cause the paste to adhere to the substrate and to render the paste electrically conductive.

Referring now to the drawings, and in particular FIGS. 1 and 2, there is shown a thick film conductor 10. The conductor 10 comprises an electrically non-conductive substrate 12 having a circuit 14 thereon. The circuit 14 is produced on the substrate 12 by applying the paste of the present invention in a pattern in the form of the circuit 14 and then heating the paste as described elsewhere herein.

The boron useful in the present invention is preferably particulate. It generally has a particle size of 0.01 to 100 microns and preferably has a particle size of 0.5 to 15 microns. The boron is preferably pure but can contain up to 10 weight percent of the impurities normally associated with boron. The boron can be in any useful form and can either be amorphous or crystalline. The boron must comprise 7 to 27 weight percent of the thick film conductor paste on a dry basis. It preferably comprises 10 to 20 weight percent of the thick film conductor paste. At percentages which are much less or are much greater, the paste when fired does not have a desirably low resistivity.

In the broadest aspects of the present invention, glass frit need not be present. However, when present, it comprises no more than 35 weight percent of the conductor paste on a dry basis. When present, it preferably comprises from 5 to 25 weight percent on a dry basis.

Any glass frit previously employed in thick film conductor pastes can be employed in the present invention; however, lead borosilicate glasses are preferred. Table 1 gives the designation of compositions of five different glass frits suitable for use in the present invention. Glass frit composition B is the preferred composition.

TABLE I

| Oxide | Designation of Composition | | | | |
|---|---|---|---|---|---|
| | A | B | C | D | E |
| $SiO_2$ | 17% | 11% | 7% | 12% | 29% |
| PbO | 69 | 81 | 86 | 9 | 54 |
| $B_2O_3$ | 10 | 4 | 3 | 2.5 | |
| $Al_2O_3$ | 3 | 3 | 3 | | 2 |
| $ZrO_2$ | 1 | 1 | 1 | | |
| $Bi_2O_3$ | | | | 71.5 | 8 |
| CaO | | | | 2 | |
| $WO_3$ | | | | 1 | |
| $Cu_2O$ | | | | 2 | 3 |
| CdO | | | | | 4 |
| Total | 100 | 100 | 100 | 100 | 100 |

The copper oxide useful in the present invention is any binary compound of copper and oxygen including $Cu_4O$, $Cu_2O$ and CuO together with any water of hydration and together with the impurities normally associated with them. The preferred copper oxides are cuprous oxide ($Cu_2O$) and cupric oxide (CuO) because of cost, availability and reactivity. The copper oxide is preferably particulate and generally has a particle size of 0.01 to 100 microns and preferably has a particle size of 0.5 to 15 microns. In accordance with the present invention, copper oxide comprises a major portion of the composition as defined elsewhere herein. On the other hand, admixture of copper oxide with copper does not adversely affect the present invention.

The presence of copper metal in the thick film conductor paste of the present invention is not required. However, copper metal does not adversely effect the novel and advantageous properties of the thick film conductor paste of the present invention. When copper metal is present, it is generally present in a ratio of copper oxide to copper metal of 100:1 to 0.1:1 and preferably 10:1 to 0.5:1.

As specified herein, all weight percentages are on a dry basis and do not take into consideration the amount of an inert liquid vehicle which is nevertheless commonly present in the paste. The more volatile components of the inert liquid vehicle normally are removed prior to firing by a simple air-drying process. However, the less volatile components of the inert liquid vehicle are removed during the firing process. As used herein, firing means heating to high temperatures as described elsewhere herein. Any inert liquid vehicle heretofore employed can be employed in the present invention. These inert liquid vehicles commonly comprise a solvent, a thickening agent and any number of optional ingredients. Suitable solvents include among other terpinol, pine oil, gylcol, esters, alcohols, ketones, acetone as well as commercially available solvents such as texanol, terpineol, butyl carbitol, butyl carbitol acetate and the like. Examples of suitable thickening agents include among others ethyl cellulose and nitro cellulose. Examples of optional ingredients include among others perfumes, coloring agents, stabilizers, and other inert ingredients. The inert liquid vehicle is commonly referred to in the art simply as the vehicle. The inert organic vehicle is present in an amount to provide the paste with a viscosity of 500 to 2,000 and preferably 800 to 1,200 poise. Viscosity is normally measured by a Brookfield HBT cone and plate viscometer at 2.50 revolutions per minute with a 1.565 cone. The solids present in the paste are normally dispersed in the inert organic vehicle at a level of generally 50 to 90 and preferably 70 to 80 weight percent solids.

Any substrate heretofore employed to produce a thick film conductor can be employed in the present invention. Preferred compositions of substrates include those of glass, ceramic such as alumina, porcelain-coated steel silicon and glass-bonded mica.

The depositing of the paste on the substrate can be accomplished by any suitable process which produces a pattern in the form of the desired circuit. Dipping, spraying and painting are suitable. However, the preferred method for depositing the paste on the substrate is to pass the paste through a screen having the desired circuit thereon as a pattern. The screen is placed in contact with the substrate and the paste forced through the mesh opening of the screen as is well known in the art. The method is commonly referred to as screen printing.

The temperature of the heating step is absolutely critical to the process of the present invention. If the heating occurs at temperatures of less than 500° C., the resistivity of the paste is not reduced to an appropriate level. Likewise, at temperatures above 675° C., the resultant air-fired paste will not have a desirably low resistivity. The heating is conducted for a time sufficient to cause the paste to adhere to the substrate and to render the paste electrically conductive. Heating times can vary widely but are generally more than ninety seconds and less than sixty minutes and are preferably 5 minutes to 20 minutes. Heating times less than ninety seconds are generally insufficient to reduce the resistivity. Heating times longer than sixty minutes generally cause an undesirable increase in resistivity. In fact, a special advantage of the present invention is the ability to use the commonly employed belt furnace having a total heating time of 25 minutes with approximately 10 minutes being at the maximum temperature. The heating can also be effected by infrared radiation.

The resistivity of the heated-in-air product is generally below 4000 and preferably below 10 ohms per square.

The invention may be better understood by reference to the following examples wherein all parts and percentages are by dry weight unless otherwise indicated. The examples are summarized in Table II. In Table II, Examples 5 and 6 are not illustrative of the present invention but rather are comparative examples. All other examples are illustrative of the present invention.

EXAMPLE 1

The following quantities and the following ingredients are combined as indicated:

| Item | Ingredient | Parts by Weight |
|---|---|---|
| A | boron | 10 |
| B | glass frit | 15 |
| C | $Cu_2O$ | 75 |

Items A, B and C are mixed in a vessel together with a vehicle which is a mixture of terpineol and ethyl cellulose in a weight ratio of 92:8 in an amount sufficient to give the paste a viscosity of 900 poise.

All resistivity readings given herein have been equilibrated to a circuit one mil (0.001 inches) thick.

The paste is screen printed onto an alumina substrate in the form of a circuit 14 shown in FIG. 1. The coated substrate is heated-in-air for 25 minues in a belt furnace. Of the 25 minutes total furnace time, 10 minutes were at 600° C. The resistivity of the film is measured with a multimeter and is found to be 0.014 ohms per square.

The results of Example 1 are recorded in Table II wherein Col. 1 gives the example number. Col. 2 indicates whether the example is inventive in which case an "I" appears in Col. 2 or is comparative, i.e., is not illustrative of the present invention, in which case a "C" appears in Col. 2. Col. 3 gives the weight percent of boron. Col. 4 gives the weight percent of glass frit. Col. 5 gives the weight percent of cuprous oxide. Col. 6 gives the weight percent of cupric oxide. Col. 7 gives the weight percent of copper metal. Col. 8 gives the glass composition, the letters appearing in Col. 8 corresponding to the designated glass compositions given in Table I herein. Col. 9 gives the resistivity measured in ohms per square.

EXAMPLES 2-17

The procedure of Example 1 is repeated except that the boron is replaced with the amount as disclosed in Col. 3 of Table II. The glass composition is that disclosed in Col. 8 of Table II and is present in the amount shown in Col. 4 of Table II. The amount of cuprous oxide or cupric oxide is that shown in Col. 5 or Col. 6 of Table II. The amount of copper metal is that shown in Col. 7 of Table II. The resistivity is measured and is recorded in Col. 9 of Table II.

DISCUSSION OF EXPERIMENTAL RESULTS

Comparative Example 5 shows the undesirably high resistivity of $6 \times 10^5$ ohms per square that is obtained when boron comprises less than 7 weight percent of the paste. Comparative Example 6 shows the undesirably high resistivity when the boron comprises more than 27 weight percent of the paste on a dry basis.

Examples 14-17 inclusive illustrate the relatively large amounts of copper metal, i.e., up to 40 weight percent that can be included in compositions of the present invention without adversely affecting the desirably low resistivity.

Although the invention has been described in considerable detail in reference to certain preferred embodiments thereof, it will be understood that modifications and variations can be made within the spirit and scope of the invention as described above and as defined in the appended claims.

TABLE II

| 1. Ex. No. | 2. I or C | 3. Boron (wt %) | 4. Glass Frit (wt %) | 5. Cu$_2$O (wt %) | 6. CuO (wt %) | 7. Cu (wt %) | 8. Glass Comp. (wt %) | 9. Resistivity (ohms/sq) |
|---|---|---|---|---|---|---|---|---|
| 1 | I | 10 | 15 | 75 | 0 | 0 | A | 0.014 |
| 2 | I | 10 | 15 | 75 | 0 | 0 | B | 0.013 |
| 3 | I | 10 | 15 | 75 | 0 | 0 | C | 0.061 |
| 4 | I | 25 | 0 | 75 | 0 | 0 | B | 1.250 |
| 5 | C | 5 | 15 | 80 | 0 | 0 | B | $6 \times 10^5$ |
| 6 | C | 30 | 0 | 70 | 0 | 0 | B | OS |
| 7 | I | 10 | 10 | 80 | 0 | 0 | B | 0.030 |
| 8 | I | 10 | 5 | 85 | 0 | 0 | B | 0.040 |
| 9 | I | 10 | 20 | 70 | 0 | 0 | B | 0.025 |
| 10 | I | 10 | 30 | 60 | 0 | 0 | B | 0.345 |
| 11 | I | 10 | 15 | 0 | 75 | 0 | B | 3.0 |
| 12 | I | 10 | 10 | 0 | 80 | 0 | B | 2000 |
| 13 | I | 15 | 15 | 0 | 70 | 0 | B | 0.044 |
| 14 | I | 10 | 15 | 65 | 0 | 10 | B | 0.022 |
| 15 | I | 10 | 15 | 55 | 0 | 20 | B | 0.014 |
| 16 | I | 10 | 15 | 45 | 0 | 30 | B | 0.015 |
| 17 | I | 10 | 15 | 35 | 0 | 40 | B | 0.014 |

OS means "off scale", i.e., a resistivity greater than $10^7$ ohms/square.

What is claimed is:
1. A thick film conductor paste of:
    A. 7 to 27 weight percent boron; and
    B. zero to 35 weight percent glass frit; and
    C. balance essentially copper oxide,
  wherein all weight percentages are on a dry basis.
2. A thick film conductor paste of
    A. 10 to 20 weight percent boron; and
    B. 5 to 25 weight percent glass frit; and
    C. balance essentially a copper oxide selected from the group consisting of cuprous oxide and cupric oxide,
  wherein all weight percentages are on a dry basis.
3. The paste of claim 2 wherein the boron is particulate.
4. The paste of claim 3 wherein the boron has a particle size of 0.01 to 100 microns.
5. The paste of claim 2 wherein the copper oxide is particulate.
6. The paste of claim 5 wherein the copper oxide has a particle size of 0.01 to 100 microns.
7. The paste of claim 1 further comprising an inert liquid vehicle present in an amount sufficient to give the paste a viscosity of 500 to 2000 poise.
8. A thick film conductor paste having a long shelf life and being fireable in air to produce on a substrate a circuit having a resistivity of less than 10 ohms per square, said paste consisting essentially of:
    A. 10 to 20 weight percent particulate boron having a particle size of 0.5 to 15 microns; and
    B. 5 to 25 weight percent glass frit having a particle size of 0.5 to 15 microns, the glass of said glass frit being a lead-borosilicate glass; and
    C. the balance essentially a copper oxide selected from the group consisting of cuprous oxide and cupric oxide;
  wherein all weight percents are on a dry basis;

said paste being dispersed in an inert liquid vehicle present in an amount sufficient to give the paste a viscosity of 800 to 1200 poise.

9. A thick film conductor paste of:
   A. 7 to 27 weight percent boron; and
   B. zero to 35 weight percent glass frit; and
   C. balance essentially a mixture of copper oxide and copper metal in a weight ratio of 100:1 to 0.1:1,
wherein all weight percentages are on a dry basis.

10. The paste of claim 9 wherein the weight ratio of copper oxide to copper metal is within the range of 10:1 to 0.5:1.

11. The paste of claim 9 having 10 to 20 weight percent boron.

12. The paste of claim 9 having 5 to 25 weight percent glass frit.

13. A method of making a thick film conductor comprising the steps of:
   I. depositing a thick film conductor paste of
      A. 7 to 27 weight percent boron; and
      B. zero to 35 weight percent glass frit; and
      C. balance essentially copper oxide on an electrically non-conductive substrate in the form of a circuit to form a coated substrate wherein all weight percentages are on a dry basis; and then
   II. heating the coated substrate in air at a temperature of 500° to 675° C. for a time sufficient to cause the paste to adhere to the substrate and to render the paste electrically conductive.

14. The method of claim 13 wherein the composition of the paste is:
   A. 10 to 20 weight percent boron; and
   B. 5 to 25 weight percent glass frit; and
   C. balance essentially copper oxide.

15. The method of claim 13 wherein the heating is conducted at a temperature of 550° to 625° C.

16. The method of claim 13 wherein the heating time is ninety seconds to sixty minutes.

17. The method of claim 13 wherein the substrate is a material selected from the group consisting of glass, ceramic, alumina, porcelain-coated steel silicon and glass-bonded mica.

18. The method of claim 13 wherein the air is atmospheric air containing approximately 20.9 weight percent oxygen.

19. A thick film conductor comprising:
   I. an electrically non-conductive substrate; and
   II. an electrically conductive circuit on the substrate which is the heated-in-air product of a thick film conductor paste of:
      A. 7 to 27 weight percent boron; and
      B. zero to 35 weight percent glass frit; and
      C. balance essentially copper oxide,
wherein all weight percentages are on a dry basis.

20. The conductor of claim 19 wherein the composition of the paste is:
   A. 10 to 20 weight percent boron; and
   B. 5 to 25 weight percent glass frit; and
   C. balance essentially copper oxide.

21. The conductor of claim 19 wherein the product of the thick film conductor paste has a resistivity of less than 10 ohms per square.

22. A thick film conductor paste consisting essentially of:
   A. 10 to 20 weight percent boron; and
   B. 5 to 25 weight percent glass frit; and
   C. balance essentially a copper oxide selected from the group consisting of cuprous oxide and cupric oxide,
wherein all weight percentages are on a dry basis.

* * * * *